United States Patent
Butler et al.

(10) Patent No.: US 8,553,199 B2
(45) Date of Patent: Oct. 8, 2013

(54) LITHOGRAPHIC APPARATUS AND DEVICE MANUFACTURING METHOD

(75) Inventors: Hans Butler, Best (NL); Marc Wilhelmus Maria Van Der Wijst, Veldhoven (NL); Johan Hendrik Geerke, Eindhoven (NL); Joost De Pee, Veldhoven (NL); Clementius Andreas Johannes Beijers, Eindhoven (NL); Marco Hendrikus Hermanus Oude Nijhuis, Eindhoven (NL); Francois Xavier Debiesme, Weert (NL)

(73) Assignee: ASML Netherlands B.V., Veldhoven (NL)

( * ) Notice: Subject to any disclaimer, the term of this patent is extended or adjusted under 35 U.S.C. 154(b) by 387 days.

(21) Appl. No.: 12/268,801

(22) Filed: Nov. 11, 2008

(65) Prior Publication Data

US 2009/0147230 A1    Jun. 11, 2009

Related U.S. Application Data

(60) Provisional application No. 60/996,504, filed on Nov. 20, 2007.

(51) Int. Cl.
*G03B 27/42*    (2006.01)
*G03B 27/32*    (2006.01)

(52) U.S. Cl.
USPC .............................................. 355/53; 355/77

(58) Field of Classification Search
USPC ....................................................... 355/67, 77
See application file for complete search history.

(56) References Cited

U.S. PATENT DOCUMENTS

| | | | |
|---|---|---|---|
| 6,359,688 B2 | 3/2002 | Akimoto et al. | |
| 6,441,884 B1 * | 8/2002 | Takahashi et al. | 355/53 |
| 6,462,828 B1 * | 10/2002 | Takeishi | 356/500 |
| 6,853,443 B2 | 2/2005 | Nishi | |
| 6,891,603 B2 | 5/2005 | Nishi | |
| 6,912,041 B2 | 6/2005 | Butler et al. | |
| 2002/0088678 A1 * | 7/2002 | Ruckman et al. | 188/378 |
| 2003/0010583 A1 * | 1/2003 | Arnold et al. | 188/106 R |
| 2003/0053035 A1 * | 3/2003 | Butler et al. | 355/53 |
| 2006/0103944 A1 * | 5/2006 | Ono et al. | 359/649 |

FOREIGN PATENT DOCUMENTS

| | | |
|---|---|---|
| JP | 11-307448 A | 11/1999 |
| JP | 2000-012435 A | 1/2000 |
| JP | 2002-289515 A | 10/2002 |
| JP | 2002-305140 A | 10/2002 |

(Continued)

OTHER PUBLICATIONS

English-Language Translation of Notice of Reasons for Rejection directed to related Japanese Patent Application No. 2008-290448, mailed Jun. 24, 2011, from the Japanese Patent Office; 6 pages.

*Primary Examiner* — Peter B Kim
*Assistant Examiner* — Michelle Iacoletti
(74) *Attorney, Agent, or Firm* — Sterne, Kessler, Goldstein & Fox P.L.L.C.

(57) ABSTRACT

A vibration damping arrangement for a lithographic apparatus includes a sensor arranged to, in use, detect a vibration of a projection system. An actuator is arranged to, in use, exert a force on a control unit of the projection system to convert an output signal of the sensor to an actuator input signal such that, during operation, the vibration of the projection system is mitigated by controlling the actuator by the input signal to exert the force to the projection system.

22 Claims, 4 Drawing Sheets

(56) References Cited

FOREIGN PATENT DOCUMENTS

| | | |
|---|---|---|
| JP | 2003-109898 A | 4/2003 |
| JP | 2004-100953 A | 4/2004 |
| JP | 2006-147989 A | 6/2006 |

\* cited by examiner

LITHOGRAPHIC APPARATUS AND DEVICE MANUFACTURING METHOD

CROSS-REFERENCE TO RELATED APPLICATION

This application claims priority to U.S. Application 60/996,504 filed on Nov. 20, 2007. The subject matter of that application is incorporated herein by reference as if fully set forth herein.

BACKGROUND

1. Field of Invention

The present invention relates to a lithographic apparatus, a vibration control method and an initialization method.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. The scanning movement as described is, in general, performed using a position device including a plurality of electromagnetic actuators and motors. Prior to the synchronous scanning of the substrate and the patterning device, both the patterning device and the substrate are accelerated to a predefined speed using the positioning device. In general, this is done by exerting a force to a chuck or object to which the patterning device or substrate is mounted. When the synchronous scanning movement is done, i.e. the pattern is irradiated on the target portion of the substrate, the positioning device is used to decelerate (or apply a negative acceleration) the patterning device and substrate.

In order to ensure that the pattern of the patterning device is projected on the appropriate target area on the substrate, accurate positioning of the patterning device with respect to the substrate is desired. A mismatch between the actual projection of the pattern and the target area may cause an overlay error which may result in a malfunctioning of the semiconductor device that is made. The accurate positioning of the patterning device and the substrate is enabled by a control unit that controls the positioning device, based on a position measurement of the patterning device and the substrate using a position measurement system such as an interferometer system or an encoder based measurement system. In order to ensure accurate projection of the pattern on the substrate, it is also desirable that the projection optics, which enable the patterned beam originating from the patterning device to be projected on the substrate, are substantially stationary. It has been noticed that due to the scanning movement of the patterning device in particular, the position of the projection optics (e.g. a projection lens) is actually not sufficiently stable but shows some vibrations. These vibrations of the projection lens may have a negative impact on the overlay performance of the lithographic apparatus and on the imaging accuracy.

SUMMARY

It is therefore desirable to provide an improved lithographic apparatus in which the vibrations of the projection system or another module of the apparatus caused by the displacements are mitigated.

According to an aspect of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; and a module to enable the projection of the patterned beam onto a target portion of the substrate, wherein the apparatus further includes a sensor arranged to, in use, detect a vibration of the module, an actuator arranged to, in use, exert a force on the module and a control unit arranged to (a) control an actuating device of the lithographic apparatus to perform a displacement, (b) measure the vibration of the module during the displacement using the sensor, (c) establish a relationship between the measured vibration and a force acting on the module, and (d) determine, using the established relationship, an actuator force that, in use, at least partly, counteracts the force acting on the module.

According to an other aspect of the present invention, there is provided a vibration control method for a lithographic apparatus including (a) performing a displacement using an actuating device of the lithographic apparatus; (b) measuring a vibration of a module of the lithographic apparatus during the displacement; (c) converting the measured vibration into a force acting on the module; (d) determining an actuator force that, at least partly, counteracts the force acting on the module; and (e) controlling the actuating device to perform a following displacement and apply the actuator force to the module thereby reducing the vibration of the module.

According to yet an other aspect of the present invention, there is provided an initialization method for a lithographic apparatus including (a) performing a scanning movement of the patterning device of the lithographic apparatus; (b) measuring a vibration of the projection system of the lithographic apparatus during the scanning movement; (c) converting the measured vibration into a force acting on the projection system; (d) determining an actuator force that, at least partly, counteracts the force acting on the projection system; (e) controlling the positioning device of the support to perform a following scanning movement and applying the actuator force thereby reducing the vibration of the projection system; and (f) repeating (b) to (e) until the vibration of the projection system is below a threshold value.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
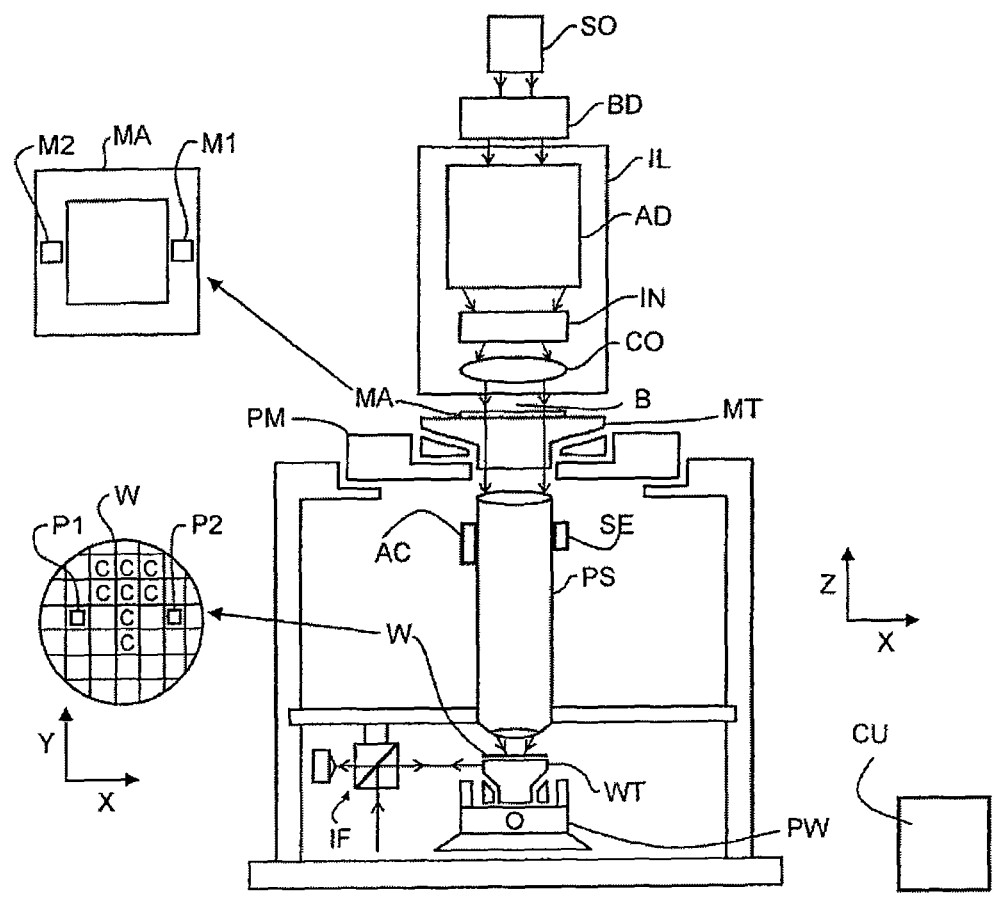
FIG. 1a depicts a lithographic apparatus according to an embodiment of the invention.

FIG. 1a schematically depicts a lithographic apparatus according to one embodiment of the invention. The apparatus includes an illumination system (illuminator) IL configured to condition a radiation beam B (e.g. UV radiation or EUV radiation); a patterning device support of support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support or support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support or support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g. mask table MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The apparatus as depicted further includes a sensor SE, arranged to detect a vibration of the projection system PS and an actuator AC, arranged to exert a force onto the projection system PS. The apparatus as shown further includes a control unit CU arranged to control the positioner PM, the sensor SE and the actuator AC. According to an embodiment of the present invention, an improved performance of the lithographic apparatus may be obtained by performing the following procedures:

Performing a scanning movement (in general, a displacement) of the patterning device (e.g. mask) MA of the lithographic apparatus. This can e.g. be done by controlling the positioner PM. Such a scanning movement in general consists of an acceleration phase, a constant velocity phase and a deceleration phase. It can further be noted that, in order to analyze the vibration of the projection system and to take countermeasures, any movement or displacement profile can be applied.

Measuring the vibration of the projection system of the lithographic apparatus during the scanning movement. By doing a scanning movement (or, in general, any movement) with the mask positioner PM, forces are exerted on the projection system. These forces can e.g. take the form of sound waves generated by the displacement of the positioner. The effect of these sound waves on the projection system may depend on several factors such as e.g. the actual profile of the movement or displacement, the machine layout i.e. the path from the positioner towards the projection system, the mechanical construction and suspension of the projection system, etc.

From the measured vibration (using the sensor SE), the force that acted on the projection system (and caused the vibration) can be calculated. As will be clear to the skilled person, the vibration of the projection system may be measured in various ways. Sensor SE may e.g. take the form of an accelerometer or a velocity sensor. Alternatively, the acceleration (or vibration) of the projection system may be derived from a position measurement of the projection system relative to a substantially stationary frame of the apparatus.

Based on the calculation of the force that acted on the projection system, an actuator force may be determined such that, when this actuator force would be applied to the projection system, it would, at least partly, counteract the force acting on the projection system, Once the actuator force is determined, the positioner PM may be controlled to perform a following scanning movement while the calculated actuator force is applied to the projection system by the actuator force. As the actuator force is arranged to, at least partly, counteract the force that caused the initial vibration of the projection system, it can be expected that the vibration of the projection system is diminished when the scanning movement is performed together with the application of the actuator force. Due to the diminished vibration of the projection system, a more accurate projection of the pattern of the patterning device (e.g. mask) MA on the substrate W can be obtained. It can however be acknowledged that when the above described process is performed, a residual vibration of the projection system may still occur. This may e.g. occur when the actuator force does not entirely match the force that caused the vibration of the projection system. In order to further improve the performance of the apparatus, the process as described above may be repeated until the residual vibration of the projection system is reduced further, e.g. below a predefined value.

It can be noted that the lithographic apparatus as depicted may be applied in different modes. In general, the apparatus as depicted may be used in at least one of the following modes:

1. In step mode, the patterning device support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As explained above, the improvement of the vibration behavior of the lithographic apparatus relies on an initial detection of the vibration of the projection system (using the positioning device of the patterning device (e.g. the positioner PM as shown in FIG. 1a) as an excitation source), a subsequent transformation of the detected vibration to a force that acted on the projection system and a further procedure of counteracting the force during a next excitation by applying a counteracting force to the projection system.

Figure 1B:
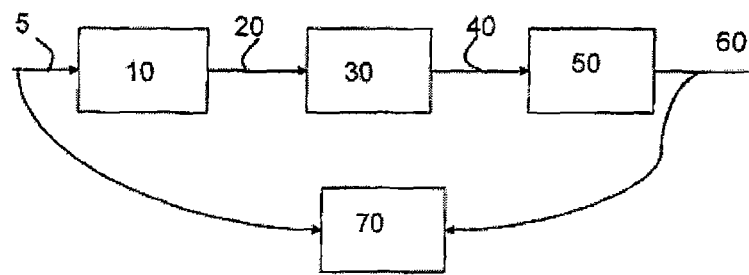
FIG. 1b schematically depicts a flow-chart according to an embodiment of the present invention.

In an embodiment of the present invention, the excitation of the projection system is done by performing a scanning movement with the positioning device of the patterning device that substantially corresponds to the movement of the patterning device under normal operation, i.e. when the apparatus is used to expose a substrate with a pattern provided on or by a patterning device. A close correspondence exists between the source of excitation as applied to analyze the vibrational behavior of the projection system and the source of excitation during normal operation. It can be stated however that this approach provides only little information on the behavior of the projection system when it is subject to another excitation source. As a consequence, the procedure as described may need to be repeated when the operating conditions of the apparatus change, e.g. a change in acceleration level, duration of acceleration. In order to avoid this, a preferred embodiment of the present invention provides in the determination of a transfer function between the excitation source and the vibration of the projection system. Alternatively, the transfer function may be determined between the excitation source and the forces acting on the projection system. The process as described above can e.g. be illustrated by a flow-chart as shown in FIG. 1b:

A positioning setpoint 5, e.g. a including a desired position as a function of time, is input into e.g. the patterning device (e.g. reticle or mask) stage system 10. As a result, the patterning device (e.g. reticle) stage will move, and produce e.g. a sound or noise 20 as a side effect. This sound or noise 20 acts as a force on the projection lens (or system) 30, causing vibration of the lens. The lens vibration (or acceleration) 40 can be measured using a sensor, for example an accelerometer. By using knowledge of the lens dynamical behavior, e.g. in the form of a model 50, it is possible to reconstruct the disturbance force on the lens. The end result is a reconstructed applied force 60 as a function of time, e.g. in the form of a table that is synchronous with the applied setpoint 5 on the reticle stage 10. A next time when the same setpoint 5 is applied to the reticle stage 10, the reconstructed applied force 60 on the lens is exerted on the lens with a negative sign, compensating for the sound-induced vibration of the scanning motion.

From the reconstructed applied force 60 in the above-mentioned table, and the reticle stage applied setpoint 5 that caused this force, it is also possible to determine a transfer function 70. Such a transfer function, when the patterning device (e.g. reticle) stage setpoint is applied to it, produces the reconstructed applied force. Main benefits are the absence of a (large) table, and more important: the transfer function also accepts other patterning device (e.g. reticle) stage setpoints than the one that caused the originally measured lens vibrations. Hence, when another setpoint is applied to the patterning device (e.g. reticle stage), it is possible to calculate the applied lens force without the need to perform an extra scanning motion.

In an embodiment of the present invention, the actuator is mounted to a frame that supports the projection system. The actuator may e.g. be a piezo-actuator arranged to exert a force on the projection system or counteract a displacement of the projection system. Such an arrangement is schematically shown in FIG. 2.

Figure 2:
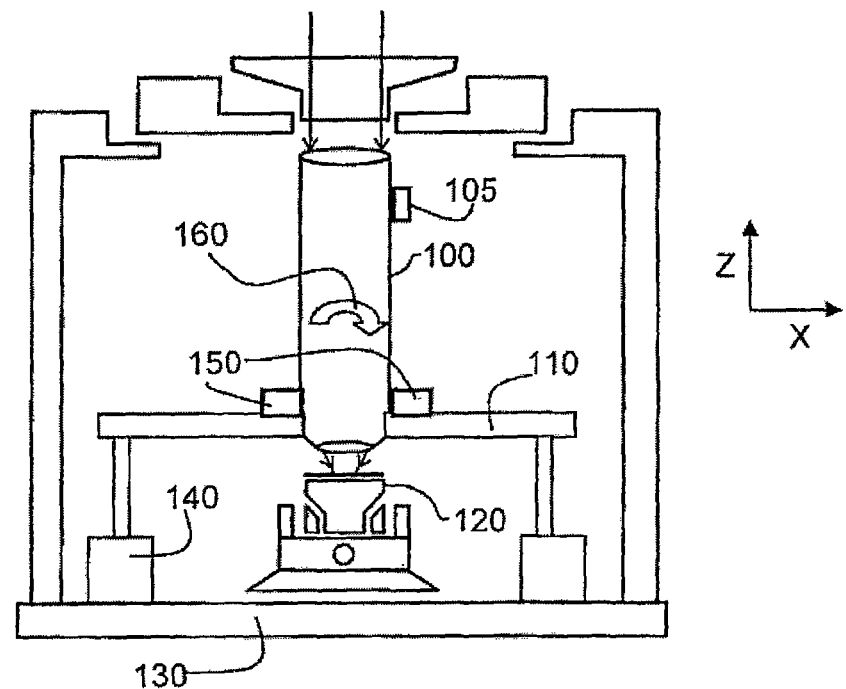
FIG. 2 depicts a lithographic apparatus according to an embodiment of the invention.

FIG. 2 shows part of a lithographic apparatus including a projection system 100 mounted to a frame 110 and a sensor 105 mounted to the projection system 100. This frame may e.g. be a metrology frame onto which a measurement system (for measuring the position of the substrate table 120) may be mounted. Preferably, the frame is isolated from the base frame 130 by vibration isolators 140 such as airmounts. Mounted to the frame 110 is an actuator 150 arranged to exert a force on the projection system. The actuator may e.g. be applied to counteract vibrations of the projection system about the Y-axis, perpendicular to the X- and Z-axis (as indicated by the arrow 160).

Figure 3:
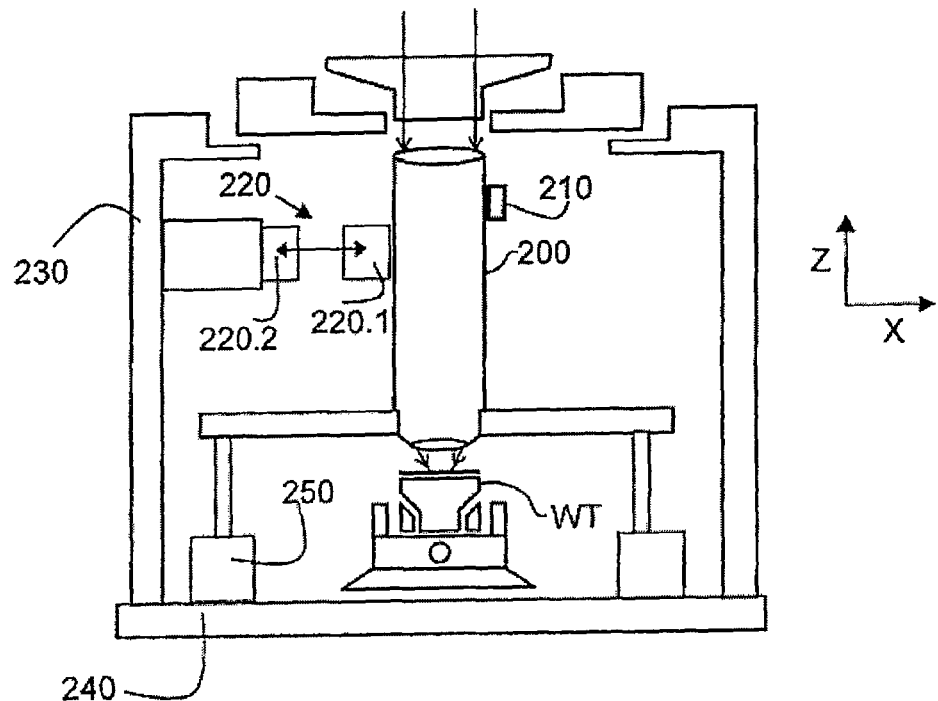
FIG. 3 depicts a lithographic apparatus according to an embodiment of the invention.

In another embodiment of the present invention, the actuator is mounted between the projection system and a frame that is isolated from the projection system. With such a system, a reaction force (equal and opposite to the actuator force exerted on the projection system) is exerted on a separate frame rather than e.g. on a metrology frame of the apparatus. By exerting the reaction force on a separate frame, the effect of this force on other parts of the apparatus may be kept small. FIG. 3 schematically depicts such an embodiment.

FIG. 3 schematically shows part of a lithographic apparatus including a projection system 200. Mounted to the projection system is a sensor 210 arranged to, in use, detect a vibration of the projection system. An actuator 220 has a part 220.1 mounted to the projection system, a second co-operating part 220.2 being mounted to a frame 230. This frame 230 is mounted to a base frame 240 on which the projection system is also mounted, via vibration isolators 250. As such, a reaction force of the actuator 220 (e.g. exerted on the frame 230 by the actuator part 220.2) may excite the frame 230 but this vibration may, due to the vibration isolation of the frame with respect to the projection system 200, at least partly be mitigated by the vibration isolators.

In a preferred embodiment, the actuator 220 includes a Lorentz actuator. Such an actuator includes, in general, first part including a coil which is arranged to co-operate with a second part including a permanent magnet. When the coil is energized, i.e. provided with an electric current, a force is generated by magnetic interaction between the magnetic field of the permanent magnet and the magnetic field generated by the coil. With such an actuator, no physical contact is needed between both parts that form the actuator. As such, a transmission of vibrations via the actuator may be avoided. In the arrangement as shown, a vibration of the base frame could e.g. excite the frame 230 and thus the second actuator part 220.2 mounted to it. In case no physical contact exists between the first part 220.1 and the second part 220.2, the vibration of the base frame is hindered to excite the projection system 200. It can further be stated that also a reluctance actuator may be suitably applied, such an actuator may also provide the benefit that no physical contact is required for the force generation.

Figure 4:
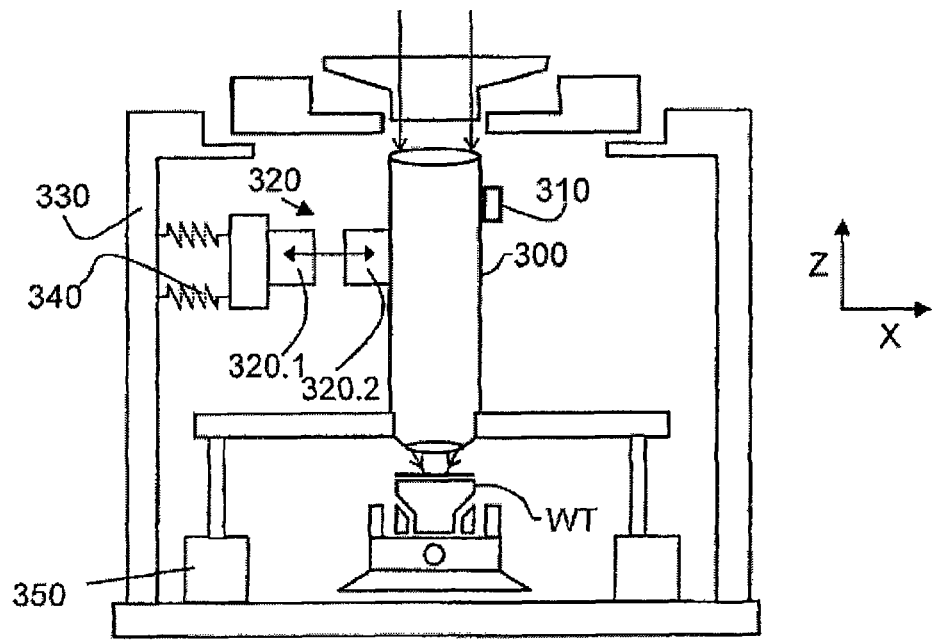
FIG. 4 depicts a lithographic apparatus according to an embodiment of the invention.

In yet another embodiment of the present invention, a reaction force of the actuator applied is exerted on a reaction mass that is mounted to the projection system, a frame or the actuator itself using a flexible member. FIG. 4 schematically depicts such an arrangement.

FIG. 4 schematically shows part of a lithographic apparatus including a projection system 300. Mounted to the projection system is a sensor 310 arranged to, in use, detect a vibration of the projection system. An actuator 320 has a part 320.2 mounted to the projection system, a second co-operating part 320.1 being mounted to a frame 330 using a flexible member 340, e.g. a spring or the like. By doing so, the reaction force exerted by the actuator on the frame can be mitigated. As such, the excitation of the frame 320 by the reaction force may be reduced thereby further reducing the excitation of the projection system 300 by the reaction force via the vibration isolators 350.

Figure 5:
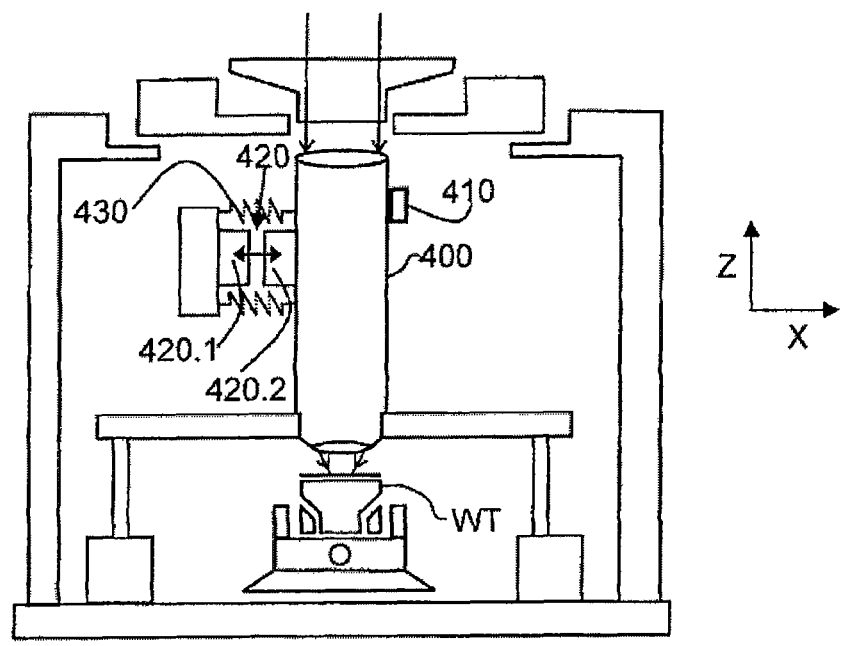
FIG. 5 depicts a lithographic apparatus according to an embodiment of the invention.

Another way to defer or mitigate the effects of the reaction force is depicted in FIG. 5 wherein the reaction force is substantially exerted on a reaction mass that is mounted to the projection system using a flexible member. FIG. 5 schematically shows part of a lithographic apparatus including a projection system 400. Mounted to the projection system is a sensor 410 arranged to, in use, detect a vibration of the projection system. An actuator 420 has a part 420.2 is mounted to the projection system, a second co-operating part 420.1 being mounted to the projection system 400 via a flexible member 430. By mounting the second part of the actuator also to the projection system rather than to a separate frame, the arrangement may be made more compact.

Figure 6:
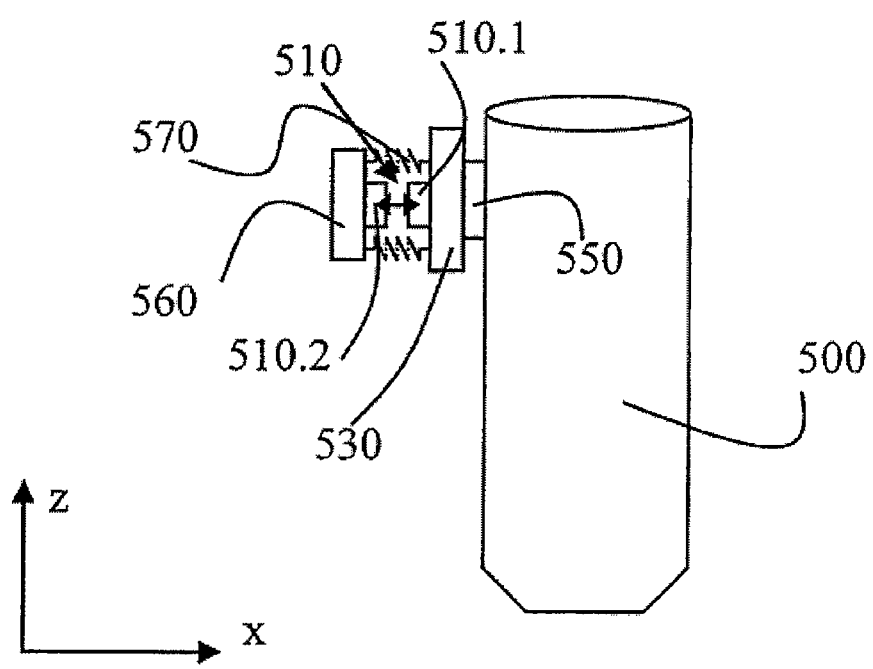
FIG. 6 depicts a lithographic apparatus according to an embodiment of the invention.

In a preferred embodiment of the present invention, the actuator force is exerted on the projection system via an interface mass, the interface mass being mounted to the projection system via a damper. FIG. 6 schematically depicts such an embodiment.

FIG. 6 schematically shows a projection system 500 and an actuator 510. In the arrangement as shown, the actuator includes a first part 510.1 and a second part 510.2. In use, a force is generated between the first and second part of the actuator, the force being exercised on an interface mass 530 which is mounted to the projection system 500 via a damper 550. A reaction force of the actuator is exerted on a reaction mass 560 which is mounted to the second part of the actuator, the reaction mass being mounted to the first part of the actuator using a flexible connection 570. Note that such flexible connection 570 may be applied in combination with a Lorentz actuator for keeping both actuator parts together within a predetermined range. Note that in case e.g. a piezo-actuator is applied, the flexible connection 570 may be omitted.

Note that the arrangement with the interface mass as shown in FIG. 6 may also be applied in combination with the actuator arrangements as shown in FIGS. 2-5.

It will be appreciated that a plurality of sensors and/or a plurality of actuators may be applied. By doing so, a more accurate detection of the various vibration modes of the projection may be established and/or a more accurate suppression of these vibration modes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

It will be appreciated that the present invention can be applied to reduce vibrations of various modules of the lithographic apparatus, not only the projection system. As an example, the present invention can also be applied to reduce vibrations of the alignment system of the lithographic apparatus.

It will be appreciated that in order to generate the vibrations on the module, various possibilities exist. As explained in the examples given above, the positioning device of the patterning device may be applied, by performing e.g. a scanning movement to excite the module of interest. Other positioning devices may equally be applied to generate this excitation, e.g. the positioning device of the substrate or a patterning device (e.g. reticle) masking device.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:
1. A lithographic apparatus comprising:
an illumination system configured to condition a radiation beam;
a patterning device support constructed to support a patterning device, the patterning device being capable of imparting the radiation beam with a pattern in its cross-section to form a patterned radiation beam;
a substrate table constructed to hold a substrate;
a first module configured and arranged to enable projection of the patterned radiation beam onto a target portion of the substrate;
a sensor mounted to the first module arranged to, in use, detect a vibration of the first module;
an actuator arranged to, in use, exert an actuator force on the first module; and a control unit configured to
(a) control an actuating device of the lithographic apparatus to perform a displacement of a second module,
(b) measure the vibration of the first module during the displacement of the second module using the sensor,
(c) represent the measured vibration of the first module as a disturbance force acting on the first module, and
(d) determine, using an established representation, the actuator force that, in use, at least partly, counteracts the disturbance force acting on the first module when applied synchronously with the displacement of the second module,
wherein the actuator includes a first part directly mounted to the first module and a second part mounted to the first module via a flexible member.

2. The lithographic apparatus according to claim 1, wherein the control unit is further configured to (e) control the actuating device of the lithographic apparatus to perform the displacement of the second module and control the actuator to apply the actuator force to reduce the vibration of the first module.

3. The lithographic apparatus according to claim 2, wherein the control unit is arranged to repeat (b) to (e) until the vibration of the first module is below a threshold value.

4. The lithographic apparatus according to claim 1, wherein the actuating device comprises a positioning device configured to position the patterning device support or the substrate table.

5. The lithographic apparatus according to claim 1, wherein the control unit is configured to determine a transfer function between the displacement of the second module and the disturbance force acting on the first module.

6. The lithographic apparatus according to claim 5, wherein the control unit is configured to store the transfer function into a table.

7. The lithographic apparatus of claim 1, wherein the actuator comprises a Lorentz actuator or a piezo-actuator.

8. The lithographic apparatus according to claim 7, wherein a reaction force to the actuator force is transmitted to a reaction mass or a frame that is, at least partly, isolated from the first module.

9. The lithographic apparatus according to claim 7, further comprising a plurality of sensors arranged to measure the vibration of the first module at different locations.

10. The lithographic apparatus according to claim 7, further comprising a plurality of actuators arranged to exert an actuator force on the first module at different locations.

11. The lithographic apparatus according to claims 1, wherein the actuator force is applied to an interface mass that is mounted to the first module via a damper.

12. The lithographic apparatus according to claim 1, wherein the first module is a projection system.

13. The lithographic apparatus according to claim 1, wherein the first module comprises an alignment system.

14. The lithographic apparatus according to claim 1, wherein the actuating device is configured to move the patterning device support or the substrate table.

15. The lithographic apparatus of claim 1, wherein the actuator force that, in use, at least partly, counteracts the disturbance force acting on the first module, is applied synchronously with a subsequent displacement of the second module and is based on a transfer function that is stored in a table.

16. A vibration control method for a lithographic apparatus comprising:
performing a displacement of an object using an actuating device of the lithographic apparatus;
measuring a vibration of a module of the lithographic apparatus during the displacement of the object, wherein the module is a projection system;
determining a transfer function by using a model of the dynamical behavior of the module to represent the measured vibration as a disturbance force acting on the module;
determining an actuator force from the transfer function that, at least partly, counteracts the disturbance force acting on the module; and
applying the actuator force, using an actuator, to the module thereby reducing the vibration of the module,
wherein the actuator includes a first part directly mounted to the projection system and a second part mounted to the projection system via a flexible member.

17. A method according to claim 16, further comprising controlling the actuating device to perform a following displacement.

18. A method according to claim 16, wherein the object is a patterning device support or a substrate table.

19. A method according to claim 16, wherein the module is a projection system or an alignment system.

20. An initialization method for a lithographic apparatus comprising:
(a) performing a scanning movement of a patterning device of the lithographic apparatus;
(b) measuring a vibration of a projection system of the lithographic apparatus during the scanning movement;
(c) determining a transfer function by using a model of the dynamical behavior of the projection system to represent the measured vibration as a disturbance force acting on the projection system;
(d) determining an actuator force from the transfer function that, at least partly, counteracts the disturbance force acting on the projection system;
(e) controlling the positioning device to perform a following scanning movement and applying the actuator force, using an actuator, thereby reducing the vibration of the projection system; and
(f) repeating (b) to (e) until the vibration of the projection system is below a threshold value,
wherein the actuator includes a first part directly mounted to the projection system and a second part mounted to the projection system via a flexible member.

21. A non-transient computer readable storage medium having program instructions stored thereon that, when executed by a processor, cause the processor to:
perform a displacement of an object using an actuating device of a lithographic apparatus;
measure a vibration of a module of the lithographic apparatus during the displacement of the object, wherein the module is a projection system;
determine a transfer function by using a model of the dynamical behavior of the module to represent the measured vibration as a disturbance force acting on the module;
determine an actuator force from the transfer function that, at least partly, counteracts the disturbance force acting on the module;
apply the actuator force, using an actuator, to the module thereby reducing the vibration of the module; and
perform at least one of storing, transmitting, or displaying the transfer function,
wherein the actuator includes a first part directly mounted to the projection system and a second part mounted to the projection system via a flexible member.

22. A non-transient computer readable storage medium having program instructions stored thereon that, when executed by a processor, cause the processor to:
(a) perform a scanning movement of a patterning device of a lithographic apparatus;
(b) measure a vibration of a projection system of the lithographic apparatus during the scanning movement;
(c) determine a transfer function by using a model of dynamical behavior of the projection system to represent the measured vibration as a disturbance force acting on the projection system;
(d) determine an actuator force from the transfer function that, at least partly, counteracts the disturbance force acting on the projection system;
(e) control the positioning device to perform a following scanning movement and applying the actuator force, using an actuator, thereby reducing the vibration of the projection system;
(f) repeat (b) to (e) until the vibration of the projection system is below a threshold value; and
(g) perform at least one of storing, transmitting, or displaying the transfer function,
wherein the actuator includes a first part directly mounted to the projection system and a second part mounted to the projection system via a flexible member.

* * * * *